United States Patent
Gao et al.

(10) Patent No.: US 12,490,551 B2
(45) Date of Patent: Dec. 2, 2025

(54) LIGHT-EMITTING EPITAXIAL STRUCTURE, METHOD FOR MANUFACTURING THE SAME AND INFRARED LIGHT-EMITTING DIODE

(71) Applicant: Quanzhou Sanan Semiconductor Technology Co., Ltd., Fujian (CN)

(72) Inventors: Wenhao Gao, Fujian (CN); Yanbin Feng, Fujian (CN); Qian Liang, Fujian (CN); Chaoyu Wu, Fujian (CN); Yu-Ren Peng, Tianjin (CN)

(73) Assignee: QUANZHOU SANAN SEMICONDUCTOR TECHNOLOGY CO., LTD., Nanan (CN)

( * ) Notice: Subject to any disclaimer, the term of this patent is extended or adjusted under 35 U.S.C. 154(b) by 544 days.

(21) Appl. No.: 17/890,067

(22) Filed: Aug. 17, 2022

(65) Prior Publication Data
US 2023/0076489 A1 Mar. 9, 2023

(30) Foreign Application Priority Data
Aug. 27, 2021 (CN) .......................... 202110992252.7

(51) Int. Cl.
*H10H 20/815* (2025.01)
*H10H 20/01* (2025.01)
*H10H 20/824* (2025.01)

(52) U.S. Cl.
CPC ........ *H10H 20/815* (2025.01); *H10H 20/013* (2025.01); *H10H 20/824* (2025.01)

(58) Field of Classification Search
None
See application file for complete search history.

(56) References Cited

U.S. PATENT DOCUMENTS

| | | | |
|---|---|---|---|
| 6,807,213 B1 * | 10/2004 | Shimoyama | H01S 5/2231 372/49.01 |
| 2003/0111667 A1 * | 6/2003 | Schubert | H10H 20/816 257/E33.068 |
| 2007/0045608 A1 * | 3/2007 | Wang | H10H 20/81 257/14 |

FOREIGN PATENT DOCUMENTS

CN 112909138 A * 6/2021 ............. H01L 33/06

OTHER PUBLICATIONS

Machine-generated English trnalsation of CN_112909138_A (Year: 2021).*

* cited by examiner

*Primary Examiner* — Bo B Jang
(74) *Attorney, Agent, or Firm* — MUNCY, GEISSLER, OLDS & LOWE, P.C.

(57) ABSTRACT

A light-emitting epitaxial structure includes an n-type ohmic contact layer, an n-type cladding layer, a light emitting layer, a p-type cladding layer, a p-type GaInP transition layer, a p-type $Al_xGa_{(1-x)}InP$ transition unit and a p-type GaP ohmic contact layer that are sequentially disposed in such order, wherein in the p-type $Al_xGa_{(1-x)}InP$ transition unit, $0 < x \leq 0.7$. An infrared light-emitting diode including the aforementioned light-emitting epitaxial structure and a method for manufacturing the light-emitting epitaxial structure are also disclosed.

8 Claims, 3 Drawing Sheets

LIGHT-EMITTING EPITAXIAL STRUCTURE, METHOD FOR MANUFACTURING THE SAME AND INFRARED LIGHT-EMITTING DIODE

CROSS-REFERENCE TO RELATED APPLICATION

This application claims priority to Chinese Invention Patent Application No. 202110992252.7, filed on Aug. 27, 2021, which is incorporated herein by reference in its entirety.

FIELD

This disclosure relates to a light-emitting epitaxial structure, a method for manufacturing thereof and an infrared light-emitting diode.

BACKGROUND

Infrared light-emitting diodes are generally semiconductors with P/N junctions made of materials (e.g., gallium arsenide) that exhibit high infrared radiation efficiency. They are important light-emitting devices and are widely applied in various fields such as photoelectric switches, remote control signal emission circuits, vehicle sensors, etc. Referring to FIG. 1, a conventional light-emitting epitaxial structure of an infrared light-emitting diode includes an n-type ohmic contact layer 10, an n-type window layer 20, an n-type cladding layer 30, a light emitting layer 40, a p-type cladding layer 50, a p-type window layer 60, a p-type GaInP transition layer 70 and a p-type GaP ohmic contact layer 90 that are arranged sequentially in such order in a bottom-top direction.

However, there is a relatively large difference in bandgap between an AlGaAs layer (e.g., the abovementioned p-type window layer 60) and a GaP layer (e.g., the abovementioned p-type GaP ohmic contact layer 90), which causes high resistance in the infrared light-emitting diode. To reduce the bandgap difference between the AlGaAs layer and the GaP layer, the GaInP transition layer 70 is disposed therebetween in the conventional light-emitting structure. Yet, there exists also a bandgap difference between the GaInP transition layer 70 and the GaP layer, so when a current flows into the light-emitting epitaxial structure (e.g., an infrared light-emitting diode), current crowding occurs in the GaInP transition layer 70, which results in high operating voltage of the infrared light-emitting diode, thereby seriously reducing the electro-optical conversion efficiency of the infrared light-emitting diode. In addition, current crowding may significantly reduce the antistatic ability of the infrared light-emitting diode. Furthermore, as resistance increases, heat emitted by the infrared light-emitting diode also increases, thereby causing junction temperature of the infrared light-emitting diode to rise, which in turn reduces the brightness and lifespan of the infrared light-emitting diode.

SUMMARY

Therefore, an object of the disclosure is to provide a light-emitting epitaxial structure and a method for manufacturing thereof that can alleviate or overcome at least one of the aforementioned shortcomings of the prior art.

According to a first aspect of the disclosure, a light-emitting epitaxial structure includes an n-type ohmic contact layer, an n-type cladding layer disposed on the n-type ohmic contact layer, a light emitting layer disposed on the n-type cladding layer opposite to the n-type ohmic contact layer, a p-type cladding layer disposed on the light emitting layer opposite to the n-type cladding layer a p-type GaInP transition layer disposed on the p-type cladding layer opposite to the light emitting layer, a p-type $Al_xGa_{(1-x)}InP$ transition unit disposed on the p-type GaInP transition layer opposite to the p-type cladding layer, and a p-type GaP ohmic contact layer disposed on the p-type $Al_xGa_{(1-x)}InP$ transition unit opposite to the p-type GaInP transition layer, wherein $0<x\leq 0.7$.

According to a second aspect of the disclosure, an infrared light-emitting diode includes the aforementioned light-emitting epitaxial structure.

According to a third aspect of the disclosure, a method for manufacturing the light-emitting epitaxial structure includes the steps of:

providing a substrate;
forming an n-type ohmic contact layer on the substrate;
forming an n-type window layer on the n-type ohmic contact layer opposite to the substrate;
forming an n-type cladding layer on the n-type window layer opposite to the n-type ohmic contact layer;
forming a light emitting layer on the n-type cladding layer opposite to the n-type window layer;
forming a p-type cladding layer on the light emitting layer opposite to the n-type cladding layer;
forming a p-type window layer on the p-type cladding layer opposite to the light emitting layer;
forming a p-type GaInP transition layer on the p-type window layer opposite to the p-type cladding layer;
forming a p-type $Al_xGa_{(1-x)}InP$ transition unit on the p-type GaInP transition layer opposite to the p-type window layer, wherein $0<x\leq 0.7$; and
forming a p-type GaP ohmic contact layer on the p-type $Al_xGa_{(1-x)}InP$ transition unit opposite to the p-type GaInP transition layer.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
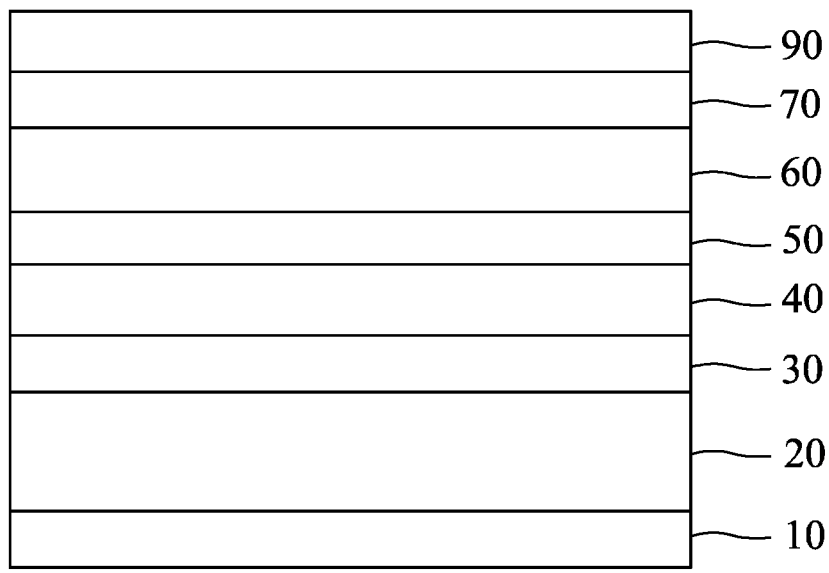
FIG. 1 is a schematic view illustrating a conventional light-emitting epitaxial structure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
FIG. 2 is a schematic view illustrating an embodiment of a light-emitting epitaxial structure according to the disclosure.

Referring to FIG. 2, an embodiment of a light-emitting epitaxial structure according to the disclosure includes an n-type ohmic contact layer 1, an n-type cladding layer 3, a light emitting layer 4, a p-type cladding layer 5, a p-type GaInP transition layer 7, a p-type $Al_xGa_{(1-x)}InP$ transition unit 8 and a p-type GaP ohmic contact layer 9 sequentially disposed in such order. In the p-type $Al_xGa_{(1-x)}InP$ transition unit 8, the value of x (i.e., an aluminum content) may be greater than 0 and not greater than 0.7 (i.e., 0<x≤0.7). In some embodiments, the value of x in the p-type $Al_xGa_{(1-x)}InP$ transition unit 8 may be greater than 0 and not greater than 0.6 (i.e., 0<x≤0.6).

Since a bandgap of the p-type GaInP transition layer 7 is 1.87 eV, and a bandgap of the p-type GaP ohmic contact layer 9 is 2.26 eV, a difference in bandgap between the p-type GaInP transition layer 7 and the p-type GaP ohmic contact layer 9 is relatively large. Due to the large difference in bandgap, lattice mismatch will occur at an interface between the p-type GaInP transition layer 7 and the p-type GaP ohmic contact layer 9, which may lead to serious defects therebetween. Therefore, the p-type $Al_xGa_{(1-x)}InP$ transition unit 8 is disposed between the p-type GaInP transition layer 7 and the p-type GaP ohmic contact layer 9 to reduce the bandgap difference therebetween and lessen the defects caused by lattice mismatch. Specifically, the p-type $Al_xGa_{(1-x)}InP$ transition unit 8 grown on the p-type GaInP transition layer 7 has fewer defects and has an aluminum content that gradually increases in a direction from the n-type ohmic contact layer 1 to the p-type GaP ohmic contact layer 9. The p-type GaP ohmic contact layer 9 grown on the p-type $Al_xGa_{(1-x)}InP$ transition unit 8 also has fewer defects.

Figure 3:
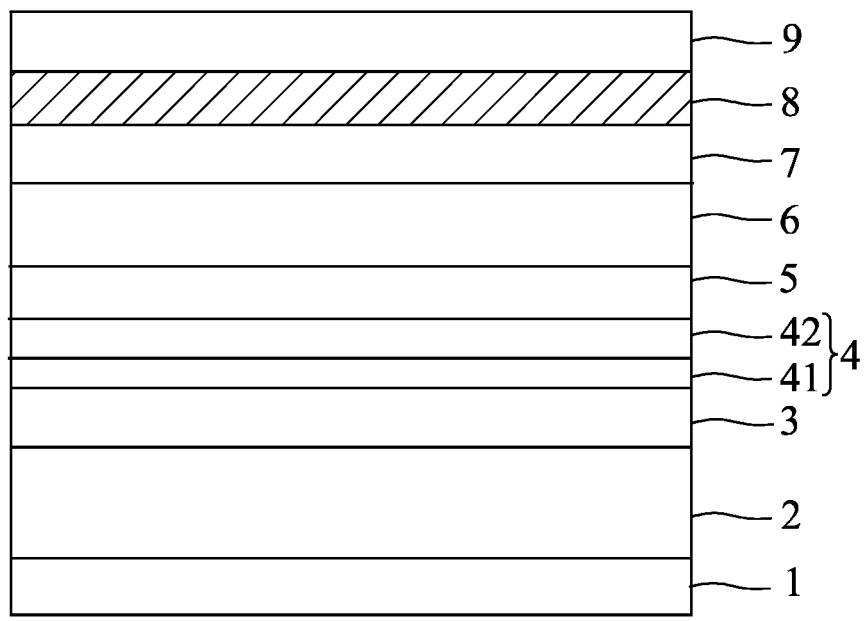
FIG. 3 is a schematic view illustrating another embodiment of the light-emitting epitaxial structure according to the disclosure.
Figure 4:
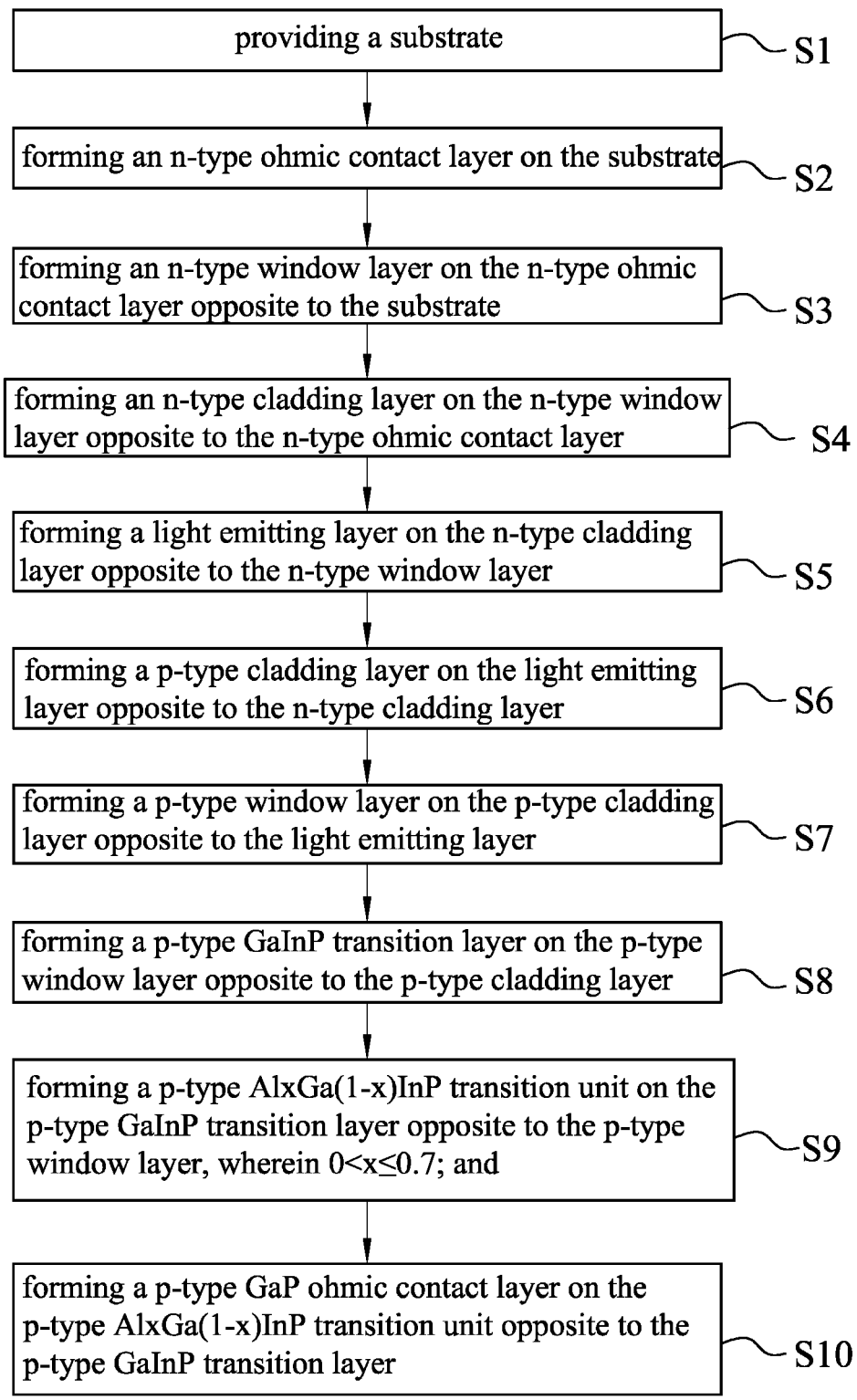
FIG. 4 is a flow chart illustrating a method for manufacturing the light-emitting epitaxial structure according to the disclosure.

As shown in FIG. 3, in another embodiment of this disclosure, the light-emitting epitaxial structure further includes, in addition to the layer elements shown in FIG. 2, an n-type window layer 2 disposed between the n-type ohmic contact layer 1 and the n-type cladding layer 3, and a p-type window layer 6 disposed between the p-type cladding layer 5 and the p-type GaInP transition layer 7. The n-type window layer 2 and the p-type window layer 6 both serve to spread current in the light-emitting epitaxial structure and achieve an even current distribution in the light-emitting epitaxial structure.

The p-type $Al_xGa_{(1-x)}InP$ transition unit 8 may have a thickness that is smaller than 500 nm. In some embodiments, the thickness of the p-type $Al_xGa_{(1-x)}InP$ transition unit 8 is 90 nm.

As mentioned above, the aluminum content of the p-type $Al_xGa_{(1-x)}InP$ transition unit 8 gradually increases. In certain embodiments, in the direction from the n-type ohmic contact layer 1 to the p-type GaP ohmic contact layer 9, the aluminum content (i.e., the x value) of the p-type $Al_xGa_{(1-x)}InP$ transition unit 8 gradually increases to 0.7 (i.e., 0<x≤0.7). In certain embodiments, the aluminum content is measured in molar ratio. In some embodiments, in the direction from the n-type ohmic contact layer 1 to the p-type GaP ohmic contact layer 9, the aluminum content of the p-type $Al_xGa_{(1-x)}InP$ transition unit 8 gradually increases to 0.6 (i.e., 0<x≤0.6). Furthermore, the p-type $Al_xGa_{(1-x)}InP$ transition unit 8 may be a layered structure, and may include a first sublayer, a second sublayer and a third sublayer that are stacked in such order in the direction from the n-type ohmic contact layer 1 to the p-type GaP ohmic contact layer 9. The first, second and third sublayers are represented by $Al_{0.15}Ga_{0.85}InP$, $Al_{0.35}Ga_{0.65}InP$ and $Al_{0.55}Ga_{0.45}InP$, respectively. In certain embodiments, the first, second and third sublayers have a thickness of 30 nm.

In certain embodiments, the p-type $Al_xGa_{(1-x)}InP$ transition unit 8 is doped with zinc. In some embodiments, a doping concentration of zinc may be 2.00E18.

In certain embodiments, as shown in FIG. 3, the light emitting layer 4 includes an InGaAs well layer 41 and an AlGaAs barrier layer 42. The AlGaAs barrier layer 42 is disposed on the InGaAs well layer 41 and away from the n-type cladding layer 3.

In some embodiments, the n-type ohmic contact layer 1 is made of gallium arsenide, and the n-type window layer 2 and the n-type cladding layer 3 are made of n-type doped aluminum gallium arsenide. A relative ratio of aluminum to gallium in the n-type window layer 2 is different from a relative ratio of aluminum to gallium in the n-type cladding layer 3. The p-type cladding layer 5 and the p-type window layer 6 are made of p-type doped aluminum gallium arsenide. A relative ratio of aluminum to gallium in the p-type cladding layer 5 is different from a relative ratio of aluminum to gallium in the p-type window layer 6. Materials and preferred values of parameters of the layers in an example of the light-emitting epitaxial structure as shown in FIG. 3 are listed in Table 1.

TABLE 1

| Layers | Materials: Dopant | Thickness (nm) | Doping Concentration | Bandgap (eV) |
|---|---|---|---|---|
| p-type GaP ohmic contact layer | GaP: C | 50 | 1.00E19 | 2.26 |
| P-type $Al_xGa_{(1-x)}InP$ transition unit | $(Al_{0.34}Ga_{0.66})_{0.46}In_{0.54}P$: Zn | 90 | 2.00E18 | 2.06 |
| P-type GaInP transition layer | $Ga_{0.46}In_{0.54}P$: Zn | 30 | 2.00E18 | 1.87 |
| p-type window layer | $Al_{0.25}Ga_{0.75}AS$: C | 3000 | 5.00E17 | 1.74 |
| p-type cladding layer | $Al_{0.45}Ga_{0.55}AS$: C | 400 | 1.00E18 | 1.98 |
| AlGaAs barrier layer in the light emitting layer | $Al_{0.25}Ga_{0.75}AS$ | 25 | — | 1.74 |
| InGaAs well layer in the light emitting layer | InGaAs | 6 | — | 1.29 |
| n-type cladding layer | $Al_{0.45}Ga_{0.55}AS$: Te | 400 | 1.00E18 | 1.98 |
| n-type window layer | $Al_{0.25}Ga_{0.75}AS$: Te | 7000 | 5.00E17 | 1.74 |
| n-type ohmic contact layer | GaAs: Si | 60 | 2.00E18 | 1.42 |

It should be noted that each of the abovementioned layers is doped with a dopant, except for the light emitting layer 4. Each of the dopants is shown in Table 1. According to the disclosure, the p-type $Al_xGa_{(1-x)}InP$ transition unit 8 is disposed between the p-type GaInP transition layer 7 and the p-type GaP ohmic contact layer 9 to reduce a strain therebetween without adversely affecting the performance of a light-emitting diode (e.g., an infrared light-emitting diode). In some embodiments, the p-type $Al_xGa_{(1-x)}InP$ transition unit 8 is a p-type $(Al_xGa(1-_x))_yIn_{(1-y)}P$ transition unit, wherein the value of y changes with a species and doping concentration of a p-type dopant in the p-type $Al_xGa_{(1-x)}InP$ transition unit 8. In certain embodiments, the value of y varies in the p-type $(Al_xGa(1-_x))_yIn_{(1-y)}P$ transition unit. As the value of y increases, a lattice constant of the p-type $(Al_xGa(1-_x))_yIn_{(1-y)}P$ transition unit decreases. As a result, the changing y value may ensure that the lattice constant of the p-type $(Al_xGa(1-_x))_yIn_{(1-y)}P$ transition unit decreases in a direction from the p-type GaInP transition layer 7 to the p-type GaP ohmic contact layer 9. In some embodiments, the p-type $(Al_xGa(1-_x))_yIn_{(1-y)}P$ transition unit is represented by $(Al_{0.34}Ga_{0.66})_{0.46}In_{0.54}P$. In addition, when the light-emitting epitaxial structure of the disclosure is grown on a gallium arsenide substrate, in an X-ray diffraction (XRD) analysis, a diffraction peak of $(Al_{0.34}Ga_{0.66})_{0.46}In_{0.54}P$ is located to the right of a diffraction peak of the gallium arsenide substrate at a 300 arcsec position, which provides a smoother transition of lattice constant. Furthermore, by adopting the light-emitting epitaxial structure of the present disclosure in the infrared light-emitting diode, under a current test with 350 mA, a forward voltage of the infrared light-emitting diode is lower than that of a conventional infrared light-emitting diode by approximately 0.02V.

This disclosure also provides an infrared light-emitting diode that includes the light-emitting epitaxial structure mentioned above.

According to this disclosure, a method for manufacturing the abovementioned light-emitting epitaxial structure includes the steps of:

S1) providing a substrate;

S2) forming the n-type ohmic contact layer 1 on the substrate;

S3) forming the n-type window layer 2 on the n-type ohmic contact layer 1 opposite to the substrate;

S4) forming the n-type cladding layer 3 on the n-type window layer 1 opposite to the n-type ohmic contact layer 1;

S5) forming the light emitting layer 4 on the n-type cladding layer 3 opposite to the n-type window layer 2;

S6) forming the p-type cladding layer 5 on the light emitting layer 4 opposite to the n-type cladding layer 3;

S7) forming the p-type window layer 6 on the p-type cladding layer 5 opposite to the light emitting layer 4;

S8) forming the p-type GaInP transition layer 7 on the p-type window layer 6 opposite to the p-type cladding layer 5;

S9) forming the p-type $Al_xGa_{(1-x)}InP$ transition unit 8 on the p-type GaInP transition layer 7 opposite to the p-type window layer 6, wherein $0<x\leq0.7$; and S10) forming the p-type GaP ohmic contact layer 9 on the p-type $Al_xGa_{(1-x)}InP$ transition unit 8 opposite to the p-type GaInP transition layer 7.

It should be noted that, to fulfill the needs of various chips, the n-type window layer 2 and the p-type window layer 6 need to undergo further processing according to a chip manufacturing process, such as roughening of a surface of the n-type window layer 2 and a surface of the p-type window layer 6, thereby improving the light extraction efficiency and the performance of the infrared light-emitting diode.

In step S5), the light emitting layer 4 includes the InGaAs well layer 41 and the AlGaAs barrier layer 42. The InGaAs well layer 41 is formed on the n-type cladding layer 3, and the AlGaAs barrier layer 42 is formed on the InGaAs well layer 41.

In step S9), the aluminum content of the p-type $Al_xGa_{(1-x)}InP$ transition unit 8 gradually increases in a direction from the n-type ohmic contact layer 1 to the p-type GaP ohmic contact layer 9 during a growth of the p-type $Al_xGa_{(1-x)}InP$ transition unit 8 as mentioned above.

The abovementioned steps of manufacturing the light-emitting epitaxial structure may also be applied in a manufacturing method of an infrared light-emitting diode.

In summary, the p-type $Al_xGa_{(1-x)}InP$ transition unit 8 that is disposed between the p-type GaInP transition layer 7 and the p-type GaP ohmic contact layer 9 provide a transition in lattice constant between the p-type GaInP transition layer 7 and the p-type GaP ohmic contact layer 9 and reduce a difference in bandgap between the p-type GaInP transition layer 7 and the p-type GaP ohmic contact layer 9, thereby eliminating current crowding, enhancing the antistatic ability, and reducing the junction temperature and operating voltage of the light-emitting diode, all of which may further improve the electro-optical conversion efficiency, brightness, and lifespan of the light-emitting diode. As a result, the purpose of this disclosure is effectively achieved and provides high commercial values.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting epitaxial structure, comprising:
   an n-type ohmic contact layer;
   an n-type cladding layer disposed on said n-type ohmic contact layer;
   a light emitting layer disposed on said n-type cladding layer opposite to said n-type ohmic contact layer;
   a p-type cladding layer disposed on said light emitting layer opposite to said n-type cladding layer;
   a p-type GaInP transition layer disposed on said p-type cladding layer opposite to said light emitting layer;
   a p-type $Al_xGa_{(1-x)}InP$ transition unit disposed on said p-type GaInP transition layer opposite to said p-type cladding layer; and
   a p-type GaP ohmic contact layer disposed on said p-type $Al_xGa_{(1-x)}InP$ transition unit opposite to said p-type GaInP transition layer,
   wherein, in said p-type $Al_xGa_{(1-x)}InP$ transition unit, $0<x\leq0.7$ is defined, and
   wherein said p-type $Al_xGa_{(1-x)}InP$ transition unit has an aluminum content that gradually increases in a direction from said n-type ohmic contact layer to said p-type GaP ohmic contact layer.

2. The light-emitting epitaxial structure of claim 1, wherein, in said p-type $Al_xGa_{(1-x)}InP$ transition unit, $0<x\leq0.6$ is defined.

3. The light-emitting epitaxial structure of claim 1, further comprising an n-type window layer disposed between said n-type ohmic contact layer and said n-type cladding layer, and a p-type window layer disposed between said p-type cladding layer and said p-type GaInP transition layer.

4. The light-emitting epitaxial structure of claim 3, wherein said n-type ohmic contact layer is made of gallium arsenide, said n-type window layer is made of n-type doped aluminum gallium arsenide, said n-type cladding layer is made of n-type doped aluminum gallium arsenide, said p-type cladding layer is made of p-type doped aluminum gallium arsenide, and said p-type window layer is made of p-type doped aluminum gallium arsenide.

5. The light-emitting epitaxial structure of claim 1, wherein said p-type $Al_xGa_{(1-x)}InP$ transition unit has a thickness that is smaller than 500 nm.

6. The light-emitting epitaxial structure of claim 1, wherein said p-type $Al_xGa_{(1-x)}InP$ transition unit includes a first sublayer, a second sublayer and a third sublayer that are stacked in such order in a direction from said n-type ohmic contact layer to said p-type GaP ohmic contact layer, said first, second and third sublayers being represented by $Al_{0.15}Ga_{0.85}InP$, $Al_{0.35}Ga_{0.65}InP$ and $Al_{0.55}Ga_{0.45}InP$, respectively.

7. The light-emitting epitaxial structure of claim 1, wherein said p-type $Al_xGa_{(1-x)}InP$ transition unit is doped with zinc.

8. An infrared light-emitting diode, comprising the light-emitting epitaxial structure as claimed in claim 1.

* * * * *